(12) United States Patent
Yen et al.

(10) Patent No.: US 12,731,718 B2
(45) Date of Patent: Sep. 8, 2026

(54) ASYMMETRIC SPIRAL INDUCTOR

(71) Applicant: REALTEK SEMICONDUCTOR CORPORATION, Hsinchu (TW)

(72) Inventors: Hsiao-Tsung Yen, Hsinchu City (TW); Yuh-Sheng Jean, Hsinchu County (TW); Ta-Hsun Yeh, Hsinchu City (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 1134 days.

(21) Appl. No.: 17/830,911

(22) Filed: Jun. 2, 2022

(65) Prior Publication Data

US 2022/0293331 A1 Sep. 15, 2022

Related U.S. Application Data

(62) Division of application No. 15/972,645, filed on May 7, 2018, now Pat. No. 11,387,034.

(30) Foreign Application Priority Data

Jun. 19, 2017 (TW) ................................ 106120290

(51) Int. Cl.
*H01F 27/28* (2006.01)
*H01F 17/00* (2006.01)
(Continued)

(52) U.S. Cl.
CPC ..... *H01F 27/2804* (2013.01); *H01F 17/0006* (2013.01); *H01F 27/29* (2013.01);
(Continued)

(58) Field of Classification Search
CPC .. H01F 27/2804; H01F 17/0006; H01F 27/29; H01F 2017/0046; H01F 2027/2809
(Continued)

(56) References Cited

U.S. PATENT DOCUMENTS 4,613,843 A 9/1986 Esper
5,635,892 A * 6/1997 Ashby ................ H01F 17/0006
336/200
(Continued)

FOREIGN PATENT DOCUMENTS

CN 101145435 A 3/2008
CN 101331586 A 12/2008
(Continued)

OTHER PUBLICATIONS

OA letter of the (U.S. Appl. No. 17/105,677) mailed on Mar. 1, 2023.
(Continued)

*Primary Examiner* — Shawki S Ismail
*Assistant Examiner* — Joselito S. Baisa
(74) *Attorney, Agent, or Firm* — WPAT, PC

(57) ABSTRACT

An asymmetric spiral inductor fabricated in a semiconductor structure includes a spiral coil, a metal segment, and a connection structure. The spiral coil is substantially disposed in a first metal layer and includes a first terminal and a second terminal. The first terminal is disposed at an outermost turn of the spiral coil, and the second terminal is disposed at an innermost turn of the spiral coil. The metal segment is disposed in a second metal layer different from the first metal layer and has a third terminal and a fourth terminal. The connection structure connects the second terminal and the third terminal. The first terminal and the fourth terminal form the two terminals of the asymmetric spiral inductor. The spiral coil is a polygon with N sides (N>4). A portion of the metal segment has a shape substantially identical to a portion of the contour of the polygon.

6 Claims, 15 Drawing Sheets

(51) Int. Cl.
*H01F 27/29* (2006.01)
*H10D 1/20* (2025.01)
*H10W 20/40* (2026.01)

(52) U.S. Cl.
CPC ............ *H10D 1/20* (2025.01); *H10W 20/497* (2026.01); *H01F 2017/0046* (2013.01); *H01F 2017/0073* (2013.01); *H01F 2017/0086* (2013.01); *H01F 2027/2809* (2013.01)

(58) Field of Classification Search
USPC .................................................. 336/190, 200
See application file for complete search history.

(56) References Cited

U.S. PATENT DOCUMENTS 5,656,849 A 8/1997 Burghartz
6,429,504 B1 8/2002 Beaussart et al.
6,603,383 B2 8/2003 Gevorgian
6,714,112 B2 * 3/2004 Beng .................. H01F 17/0006 336/200
7,312,684 B2 12/2007 Aoki
7,626,480 B2 12/2009 Lee
8,183,971 B2 5/2012 Le Guillou
8,198,970 B2 6/2012 Choi
8,441,333 B2 5/2013 Chiu et al.
10,283,257 B2 * 5/2019 Kim ........................ H10D 1/20
10,340,880 B2 7/2019 Yen
10,825,597 B2 11/2020 Yen
2002/0101322 A1 8/2002 Liu
2004/0075521 A1 4/2004 Yu
2006/0077028 A1 4/2006 Huang
2007/0247269 A1 10/2007 Papananos
2009/0284339 A1 11/2009 Choi
2009/0289727 A1 11/2009 El Rai
2010/0109123 A1 * 5/2010 Strzalkowski ...... H01F 17/0013 336/200
2010/0117737 A1 5/2010 Kondo
2011/0018672 A1 * 1/2011 Papananos .......... H01F 27/2804 336/200
2011/0309907 A1 12/2011 Kuroda
2012/0242406 A1 * 9/2012 Ke ...................... H01F 27/2804 330/195
2012/0299682 A1 * 11/2012 Tsai .................... H10W 20/497 336/192
2014/0070913 A1 3/2014 Beer
2015/0091687 A1 4/2015 Valentin
2015/0130579 A1 * 5/2015 Kim ........................ H01F 41/06 336/200
2015/0310980 A1 10/2015 Yen
2017/0117079 A1 4/2017 Yen
2017/0162318 A1 6/2017 Yen
2018/0151287 A1 5/2018 Yosui
2018/0366254 A1 12/2018 Yen et al.
2019/0214175 A1 * 7/2019 Yen ........................ H01F 41/06

FOREIGN PATENT DOCUMENTS

CN 103779320 A 5/2014
CN 104733426 A * 6/2015
CN 105023739 A 11/2015
CN 109860146 6/2019
EP 1085538 A1 3/2001
JP 200160515 A 3/2001
TW 201335957 A 9/2013
TW 201541476 A 11/2015

OTHER PUBLICATIONS

OA letter of the (U.S. Appl. No. 17/085,039) mailed on Sep. 22, 2022, USPTO.
OA letter of the (U.S. Appl. No. 17/105,677) mailed on Aug. 14, 2023.

* cited by examiner

ASYMMETRIC SPIRAL INDUCTOR

BACKGROUND OF THE INVENTION

1. Field of the Invention

The present invention generally relates to integrated inductors, and, more particularly, to asymmetric spiral integrated inductors.

2. Description of Related Art

FIG. 1 and FIG. 2 respectively show an asymmetric spiral inductor and a symmetric spiral inductor of conventional types. The asymmetric spiral inductor 100 and the symmetric spiral inductor 200 are planar structures and are mainly made up of metal segments in two metal layers, which are respectively represented in gray and black. The metal segments in different metal layers are connected by through structures 105, such as a via structure or a via array in a semiconductor process. In general, the symmetric spiral inductor 200 is suitable for differential signals because it is symmetric in structure, while the asymmetric spiral inductor 100 is suitable for single-ended signals.

One of the approaches to increase the inductance of the asymmetric spiral inductor 100 and the symmetric spiral inductor 200 is to increase their numbers of turns. In addition to an increase in the area of the asymmetric spiral inductor 100 and the symmetric spiral inductor 200, the increase in the numbers of turns results in increases in parasitic series resistance and parasitic capacitance as well. High parasitic series resistance and parasitic capacitance cause the self-resonant frequency and the quality factor Q of the asymmetric spiral inductor 100 and the symmetric spiral inductor 200 to decrease. In addition, metal loss and substrate loss are also key factors that affect the quality factor Q. Metal loss is due to the resistance of the metal itself. There are two reasons for substrate loss. The first reason is that when the inductor is in operation, a time-varying electric displacement between the metal coil of the inductor and the substrate is generated; this electric displacement results in a displacement current between the metal coil and the substrate, and this displacement current penetrates into the substrate of low impedance, thereby causing energy loss. The displacement current is associated with the coil area of the inductor. The larger the area, the larger the displacement current. The second reason is that the time-varying electromagnetic field of the inductor penetrates through the dielectric and generates a magnetically induced eddy current on the substrate. The magnetically induced eddy current and the inductor current are opposite in directions, resulting in energy loss.

When the inductor is operated at low frequencies, the current in the metal coil is evenly distributed. In this case, the metal loss at low frequencies is due to the series resistance of the metal coil. When the inductor is operated at high frequencies, the metal coil closer to the inner turns generates stronger magnetic field; a strong magnetic field induces eddy currents in the inner turns of the metal coil. The eddy currents cause uneven distribution of currents—most of the currents are pushed to the surface of the metal coil; this phenomenon is known as the skin effect. Because the currents pass through a smaller metal cross section in the skin effect, the currents encounter a greater resistance, thereby resulting in decrease in the quality factor Q.

Therefore, it is important in the art to improve the quality factor Q and the inductance of the inductor without increasing the inductor area.

SUMMARY OF THE INVENTION

In view of the issues of the prior art, an object of the present invention is to provide an asymmetric spiral inductor, so as to make an improvement to the prior art.

An asymmetric spiral inductor fabricated in a semiconductor structure is provided. The asymmetric spiral inductor includes a first metal segment, a second metal segment, and a connection structure. The first metal segment is in a first metal layer, substantially forms a spiral coil, and has a first terminal and a second terminal. The second metal segment is in a second metal layer different from the first metal layer and has a third terminal and a fourth terminal. The connection structure connects the second terminal and the third terminal. The first terminal and the fourth terminal form two terminals of the asymmetric spiral inductor. The spiral coil is a polygon with N sides (N>4). A portion of the second metal segment extends along a portion of the edge of the polygon, and the length of the second metal segment is not greater than one turn of the spiral coil. When the asymmetric spiral inductor is operated at a frequency substantially greater than or equal to 5 GHz, a difference between a first quality factor corresponding to a first case where a signal is inputted to the asymmetric spiral inductor from the first terminal and a second quality factor corresponding to a second case where a signal is inputted to the asymmetric spiral inductor from the fourth terminal is greater than 2.7.

Another asymmetric spiral inductor fabricated in a semiconductor structure is also provided. The asymmetric spiral inductor includes a spiral coil, a metal segment, and a connection structure. The spiral coil is substantially disposed in a first metal layer and has a first terminal and a second terminal. The first terminal is disposed at an outermost turn of the spiral coil, and the second terminal is disposed at an innermost turn of the spiral coil. The metal segment is disposed in a second metal layer different from the first metal layer and has a third terminal and a fourth terminal. The connection structure connects the second terminal and the third terminal. The first terminal and the fourth terminal form two terminals of the asymmetric spiral inductor. The spiral coil is a polygon with N sides (N>4). A portion of the metal segment has a shape substantially the same as a portion of the contour of the polygon. When the asymmetric spiral inductor is operated at a frequency substantially greater than or equal to 5 GHz, a difference between a first quality factor corresponding to a first case where a signal is inputted to the asymmetric spiral inductor from the first terminal and a second quality factor corresponding to a second case where a signal is inputted to the asymmetric spiral inductor from the fourth terminal is greater than 2.7.

Compared with the prior art, the asymmetric spiral inductor of the present invention can improve the inductance and the quality factor Q without increasing the overall area. In addition, the asymmetric spiral inductor of the present invention has asymmetric quality factors, which is beneficial to suppressing the interference of reflected signals.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes asymmetric spiral inductors. On account of that some or all elements of the asymmetric spiral inductors could be known, the detail of such elements is omitted provided that such detail has little to do with the features of this disclosure and this omission nowhere dissatisfies the specification and enablement requirements. A person having ordinary skill in the art can choose components equivalent to those described in this specification to carry out the present invention, which means that the scope of this invention is not limited to the embodiments in the specification.

Figure 1:
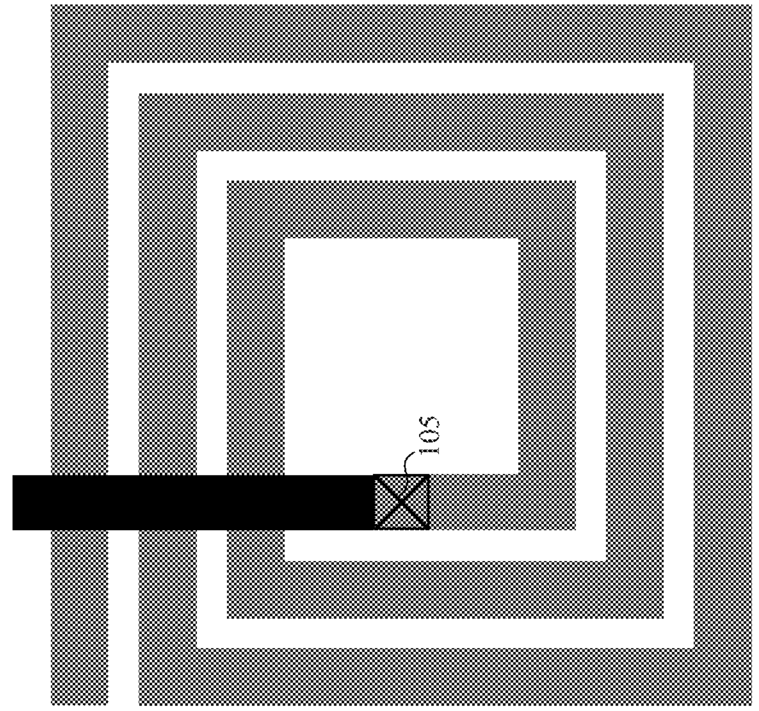
FIG. 1 illustrates an asymmetric spiral inductor.
Figure 2:
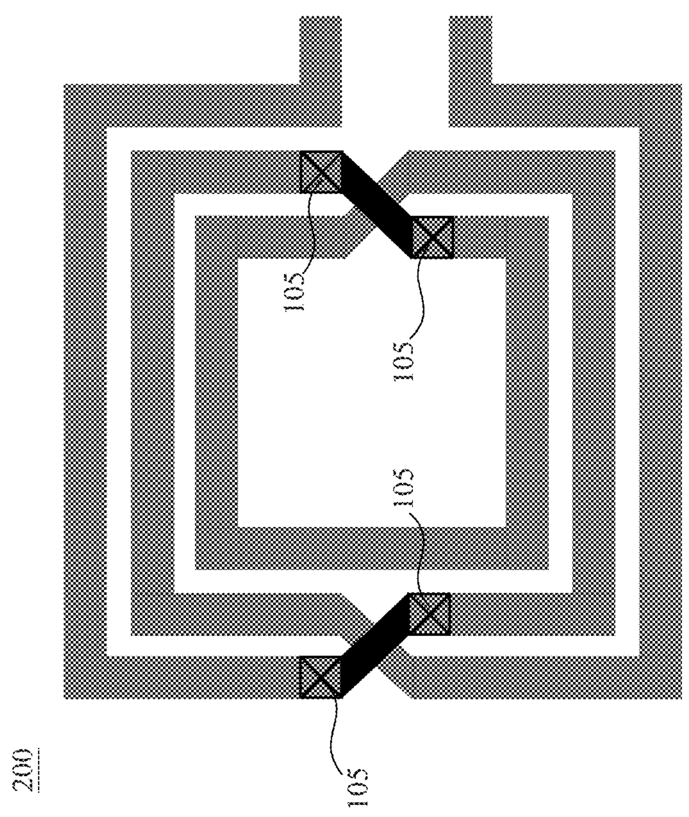
FIG. 2 illustrates a symmetric spiral inductor.
Figure 3A:
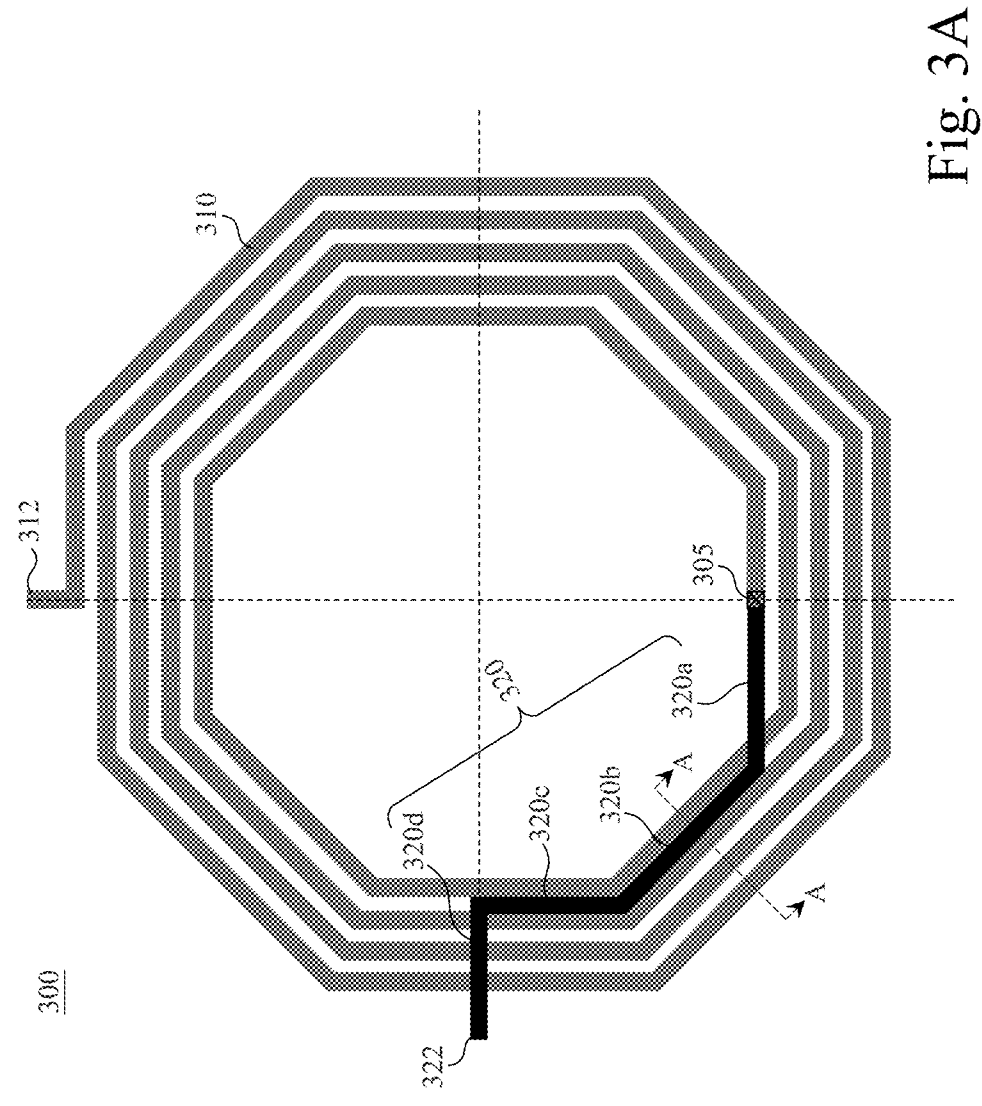
FIG. 3A illustrates the structure of an asymmetric spiral inductor according to an embodiment of the present invention.

FIG. 3A shows the structure of an asymmetric spiral inductor according to an embodiment of the present invention. The asymmetric spiral inductor 300 is fabricated in a semiconductor structure and mainly includes a metal segment 310 and a metal segment 320. In this embodiment, the metal segment 310 is fabricated in the lower metal layer (represented in gray), and the metal segment 320 is fabricated in the upper metal layer (represented in black). For example, the lower metal layer can be an ultra-thick metal (UTM) layer in a semiconductor structure, and the upper metal layer can be a re-distribution layer (RDL) in the semiconductor structure. The metal segment 310 and the metal segment 320 are connected by a connection structure 305 such as a via structure or a via array in a semiconductor process. The metal segment 310 has two terminals, one of which is the terminal 312, and the other of which is connected to the metal segment 320 through the connection structure 305. Similarly, the metal segment 320 has two terminals, one of which is the terminal 322, and the other of which is connected to the metal segment 310 through the connection structure 305. Being connected, the metal segment 310 and the metal segment 320 together form the asymmetric spiral inductor 300. The two terminals of the asymmetric spiral inductor 300 are the terminal 312 and the terminal 322.

The metal segment 310 itself forms a spiral coil, which is substantially disposed in the same metal layer. In a preferred embodiment, the number of turns of the metal segment 310 is greater than or equal to one. The terminal 312 is disposed at the outermost turn of the spiral coil, while the other terminal of the metal segment 310 (the terminal directly connected to the connection structure 305) is disposed at the innermost turn of the spiral coil. The metal segment 320 may be regarded as including multiple metal sub-segments **320*a* to 320*d* when it is broken down into fragments by the turning points. The metal sub-segment 320*a* extends from the innermost turn of the spiral coil (i.e., starting from the connection structure 305) to a place between the innermost turn of the spiral coil and the outermost turn of the spiral coil. More specifically, the metal sub-segment 320*a* crosses at least one turn of the spiral coil (one turn for this embodiment); that is, the metal sub-segment 320*a* partially overlaps with the metal segment 310. Starting from one terminal of the metal sub-segment 320*a* and substantially disposed between the innermost turn of the spiral coil and the outermost turn of the spiral coil, the metal sub-segment 320*b* extends along the contour of the spiral coil. More specifically, the spiral coil is a polygon with N sides (N>4), and the metal sub-segment 320*b* extends along one of the sides of the polygon and is substantially parallel to that side. In other words, the metal sub-segment 320*b* corresponds to a part of the metal sub-segments of the metal segment 310, with the part of the metal sub-segments being adjacent to the projection of the metal sub-segment 320*b* on the lower metal layer and substantially parallel to the metal sub-segment 320*b*. Similarly, starting from one terminal of the metal sub-segment 320*b* and substantially disposed between the innermost turn of the spiral coil and the outermost turn of the spiral coil, the metal sub-segment 320*c* extends along the contour of the spiral coil. More specifically, the metal sub-segment 320*c* extends along one of the sides of the polygon and is substantially parallel to that side. In other words, the metal sub-segment 320*c* corresponds to a part of the metal sub-segments of the metal segment 310, with the part of the metal sub-segments being adjacent to the projection of the metal sub-segment 320*c*** on the lower metal layer and substantially parallel to the metal sub-segment 320*c*. Practically, the metal sub-segment 320*a* and the metal sub-segment 320*b* form a polyline metal segment whose shape is substantially the same as a partial contour of the polygon. The metal sub-segment 320*d* extends from one terminal of the metal sub-segment 320*c* to the outside of the outermost turn of the spiral coil; more specifically, the metal sub-segment 320*d* extends from a place between the innermost turn of the spiral coil and the outermost turn of the spiral coil to a range not surrounded by the outermost turn of the spiral coil. The metal sub-segment 320*d* crosses at least one turn of the spiral coil (three turns for this embodiment); that is, the metal sub-segment 320*d* partially overlaps with the metal segment 310.

Figure 3B:
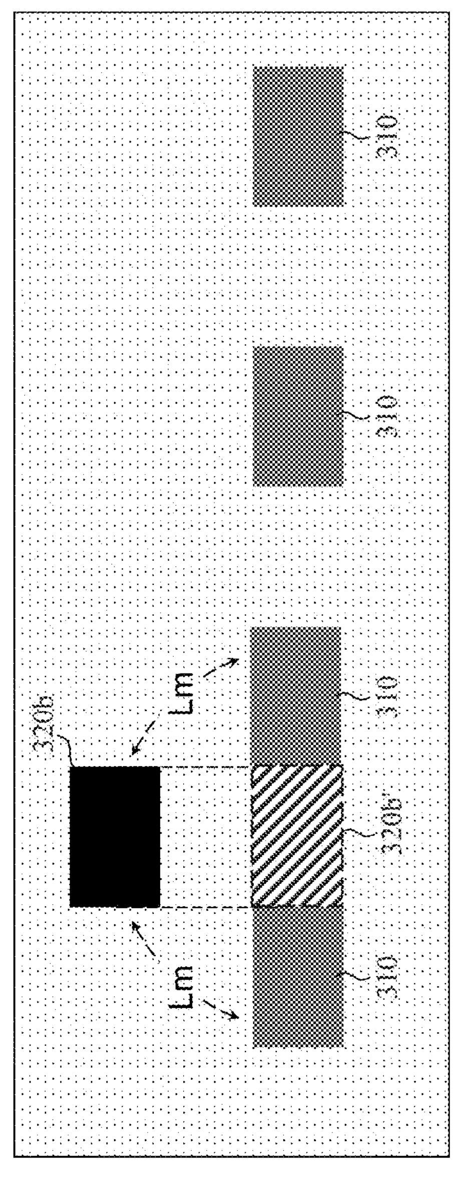
FIG. 3B illustrates a cross-sectional view corresponding to the cross section A-A of FIG. 3A according to an embodiment of this invention.
Figure 3C:
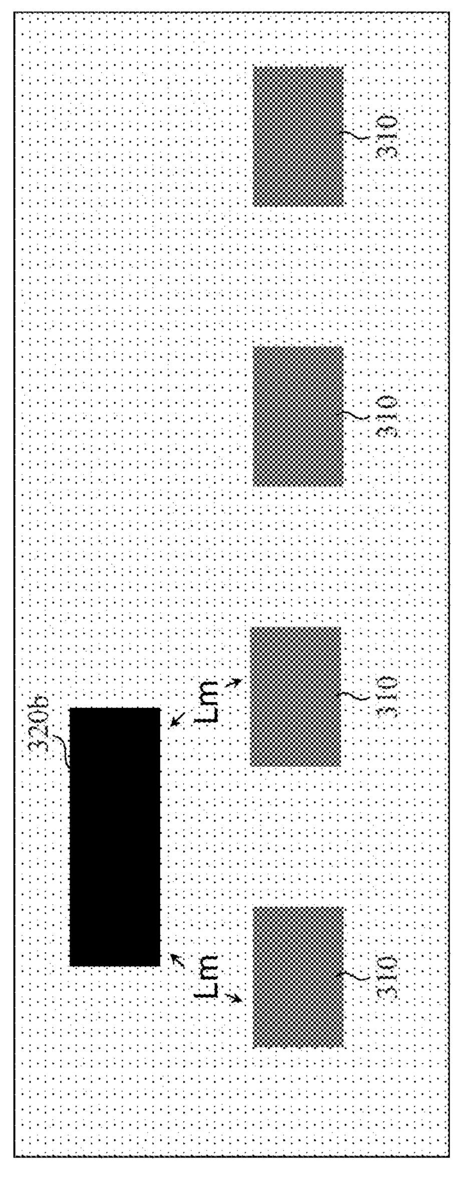
FIG. 3C illustrates a cross-sectional view corresponding to the cross section A-A of FIG. 3A according to another embodiment of this invention.

FIG. 3B is a cross-sectional view corresponding to the cross section A-A of FIG. 3A according to an embodiment of this invention. In one embodiment, the metal sub-segment 320*b* does not overlap with the metal segment 310; that is, the projection of the metal sub-segment 320*b* on the lower metal layer (i.e., the metal layer in which the metal segment 310 is disposed) is between two turns of the spiral coil. In other words, the width of the metal sub-segment 320*b* is smaller than or equal to the gap between the metal segment 310 adjacent to the projection 320*b*'. FIG. 3C is a cross-sectional view corresponding to the cross section A-A of FIG. 3A according to another embodiment of this invention. In this embodiment, the metal sub-segment 320*b* and the metal segment 310 at least partially overlap; that is, the width of the metal sub-segment 320*b* is greater than the gap between the adjacent metal segment 310. As shown in FIG. 3B and FIG. 3C, mutual inductance Lm is generated between the metal sub-segment 320*b* and its neighboring metal segments 310. Since the overall inductance of the asymmetric spiral inductor 300 includes the self-inductance portion (mainly from the mutual induction among the metal sub-segments of the metal segment 310) and the mutual-inductance portion (mainly from the mutual induction between the metal segment 310 and the metal segment 320), increasing the mutual inductance helps to improve the overall inductance of the asymmetric spiral inductor 300. The magnitude of the mutual inductance Lm can be adjusted by changing the width of the metal sub-segment 320*b*. Note that although FIGS. 3B and 3C show the cross-sectional view of the metal sub-segment 320*b*, the foregoing discussion regarding FIG. 3B and FIG. 3C also applies to the metal sub-segment 320*c*.

Figure 4A:
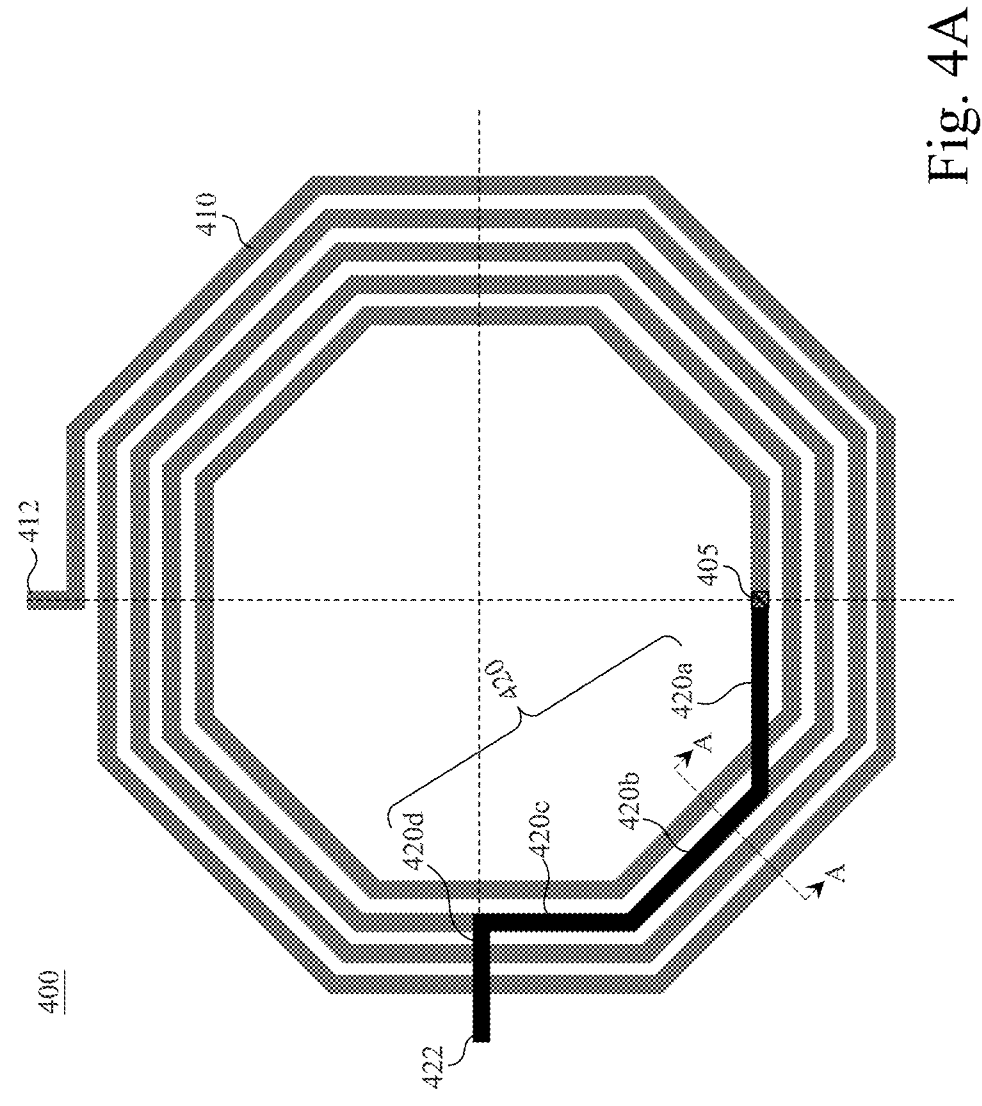
FIG. 4A illustrates a structure of the asymmetric spiral inductor according to another embodiment of the present invention.

FIG. 4A is a structure of the asymmetric spiral inductor according to another embodiment of the present invention. The asymmetric spiral inductor 400 is fabricated in a semiconductor structure and mainly includes a metal segment 410 and a metal segment 420, which includes the metal sub-segments 420*a* to 420*d*. In this embodiment, the metal segment 410 is fabricated in the lower metal layer, and the metal segment 420 is fabricated in the upper metal layer. The metal segment 410 and the metal segment 420 are connected by the connection structure 405. The metal segment 410 has two terminals, one of which is the terminal 412, and the other of which is connected to the metal segment 420 through the connection structure 405. Similarly, the metal segment 420 has two terminals, one of which is the terminal 422, and the other of which is connected to the metal segment 410 through the connection structure 405. Being connected, the metal segment 410 and the metal segment 420 together form an asymmetric spiral inductor 400. The two terminals of the asymmetric spiral inductor 400 are the terminal 412 and the terminal 422.

Figure 4B:
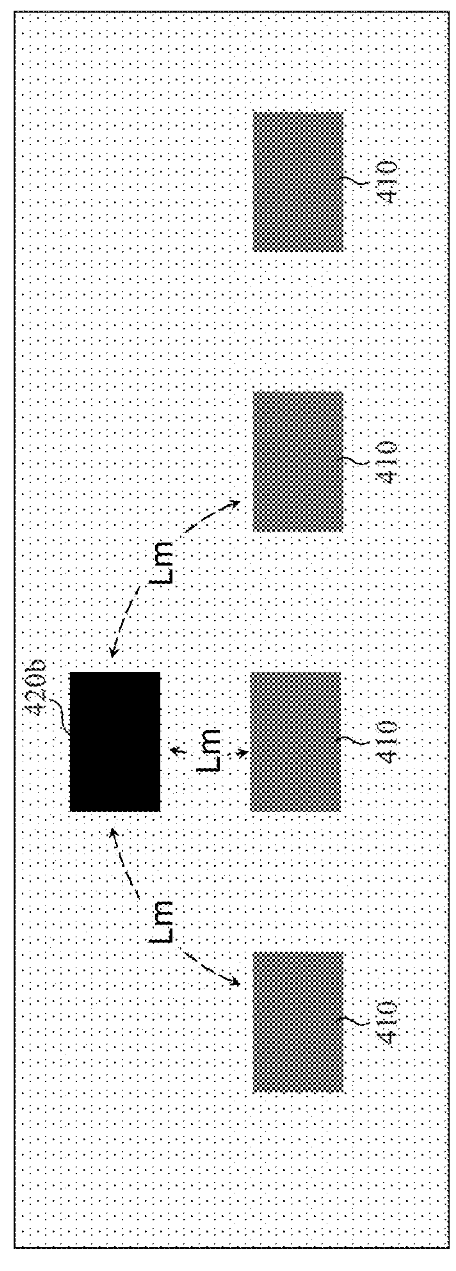
FIG. 4B illustrates a cross-sectional view corresponding to the cross section A-A of FIG. 4A.

The metal segment 420 is similar to the metal segment 320, except that part of the metal sub-segments (i.e., 420*b* and 420*c*) of the metal segment 420 substantially overlaps with the metal segment 410. FIG. 4B is a cross-sectional view corresponding to the cross section A-A of FIG. 4A. In this embodiment, the metal sub-segment 420*b* substantially overlaps with part of one of the turns of the metal segment 410. The width of the metal segment 420 may be substantially equal to the width of the metal segment 410 right beneath the metal segment 420, or may be greater or smaller than the width of the metal segment 410 right beneath the metal segment 420. As shown, there is mutual inductance Lm between the metal sub-segment 420*b* and its adjacent metal segment 410, which is beneficial to increasing the overall inductance of the asymmetric spiral inductor 400. Note that although FIG. 4B shows the cross-sectional view of the metal sub-segment 420*b*, the foregoing discussion regarding FIG. 4B also applies to the metal sub-segment 420*c*.

Figure 5:
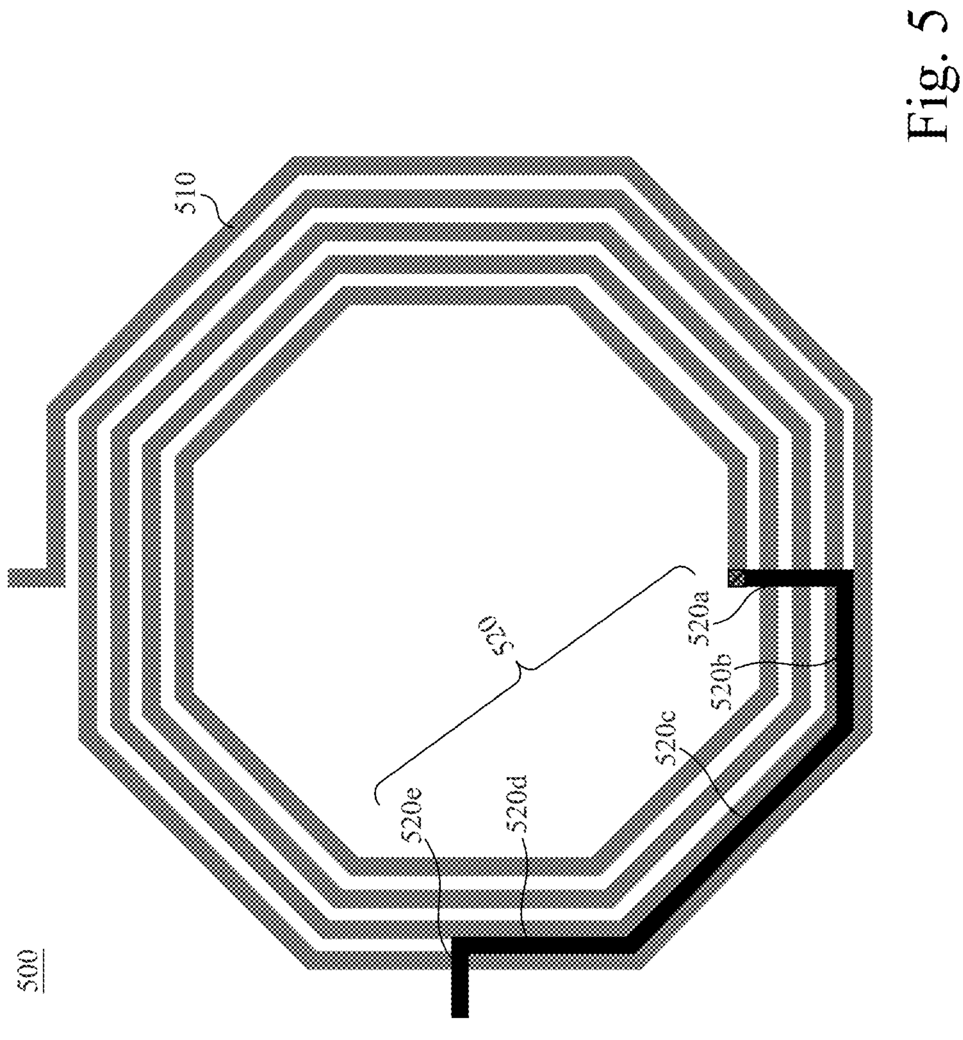
FIG. 5 illustrates a structure of the asymmetric spiral inductor according to another embodiment of the present invention.

FIG. 5 is a structure of the asymmetric spiral inductor according to another embodiment of the present invention. The asymmetric spiral inductor 500 is fabricated in a semiconductor structure and mainly includes the metal segment 510 and the metal segment 520, which includes the metal sub-segments 520*a* to 520*e*. In this embodiment, the metal sub-segment 520*a* crosses at least one of the turns of the spiral coil (three turns for this embodiment); that is, the metal sub-segment 520*a* partially overlaps with the metal segment 510. The spiral coil is a polygon with N sides (N>4), and the metal sub-segments 520*b*, 520*c* and 520*d* each extend along one of the sides of the polygon and are substantially parallel to the side. In other words, the metal sub-segments 520*b*, 520*c*, and 520*d* each correspond to a portion of the metal sub-segments of the metal segment 510, with the portion of the metal sub-segments of the metal segment 510 being adjacent to the projections of the metal sub-segments 520*b*, 520*c* or 520*d* on the lower metal layer and substantially parallel to the metal sub-segments 520*b*, 520*c* or 520*d*. The metal sub-segment 520*b*, the metal sub-segment 520*c* and the metal sub-segment 520*d* form a polyline metal segment whose shape is substantially the same as a partial contour of the polygon. The metal sub-segment 520*e* extends from one terminal of the metal sub-segment 520*d* to the outside of the outermost turn of the spiral coil. More specifically, the metal sub-segment 520*e* extends from a place between the innermost turn of the spiral coil and the outermost turn of the spiral coil to a range that is not surrounded by the outermost turn of the spiral coil. The metal sub-segment 520*e* crosses at least one turn of the spiral coil (one turn for this embodiment); that is, the metal sub-segment 520*e* partially overlaps with the metal segment 510.

Figure 6:
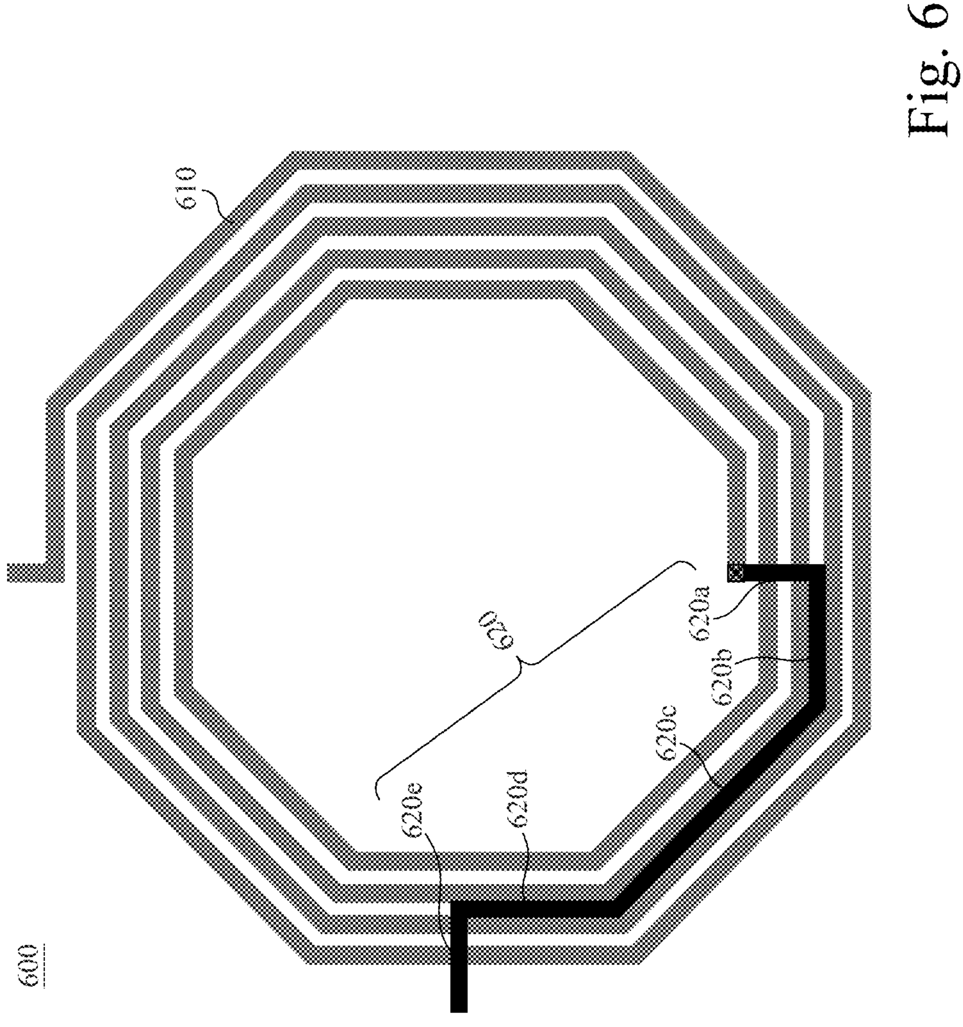
FIG. 6 illustrates a structure of the asymmetric spiral inductor according to another embodiment of the present invention.

FIG. 6 is a structure of the asymmetric spiral inductor according to another embodiment of the present invention. The asymmetric spiral inductor 600 is fabricated in a semiconductor structure and mainly includes a metal segment 610 and a metal segment 620, which includes the metal sub-segments 620*a* to 620*e*. Similar to FIG. 5, the metal sub-segment 620*a* crosses at least one turn of the spiral coil (two turns for this embodiment), and the metal sub-segment 620*e* crosses at least one turn of the spiral coil (tow turns for this embodiment). The metal sub-segment 620*b*, the metal sub-segment 620*c*, and the metal sub-segment 620*d* form a polyline metal segment whose shape is substantially the same as a partial contour of the polygon.

Figure 7:
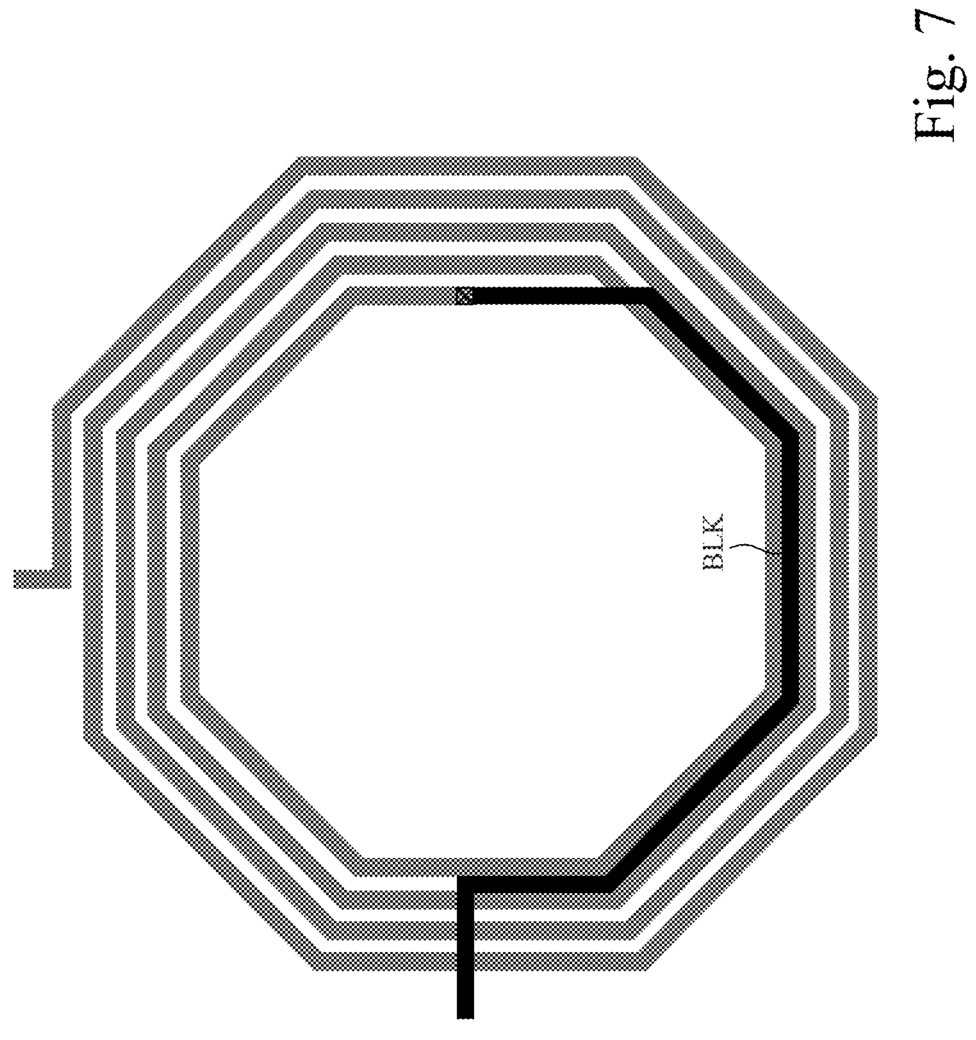
FIG. 7 illustrates a structure of the asymmetric spiral inductor according to another embodiment of the present invention.
Figure 8:
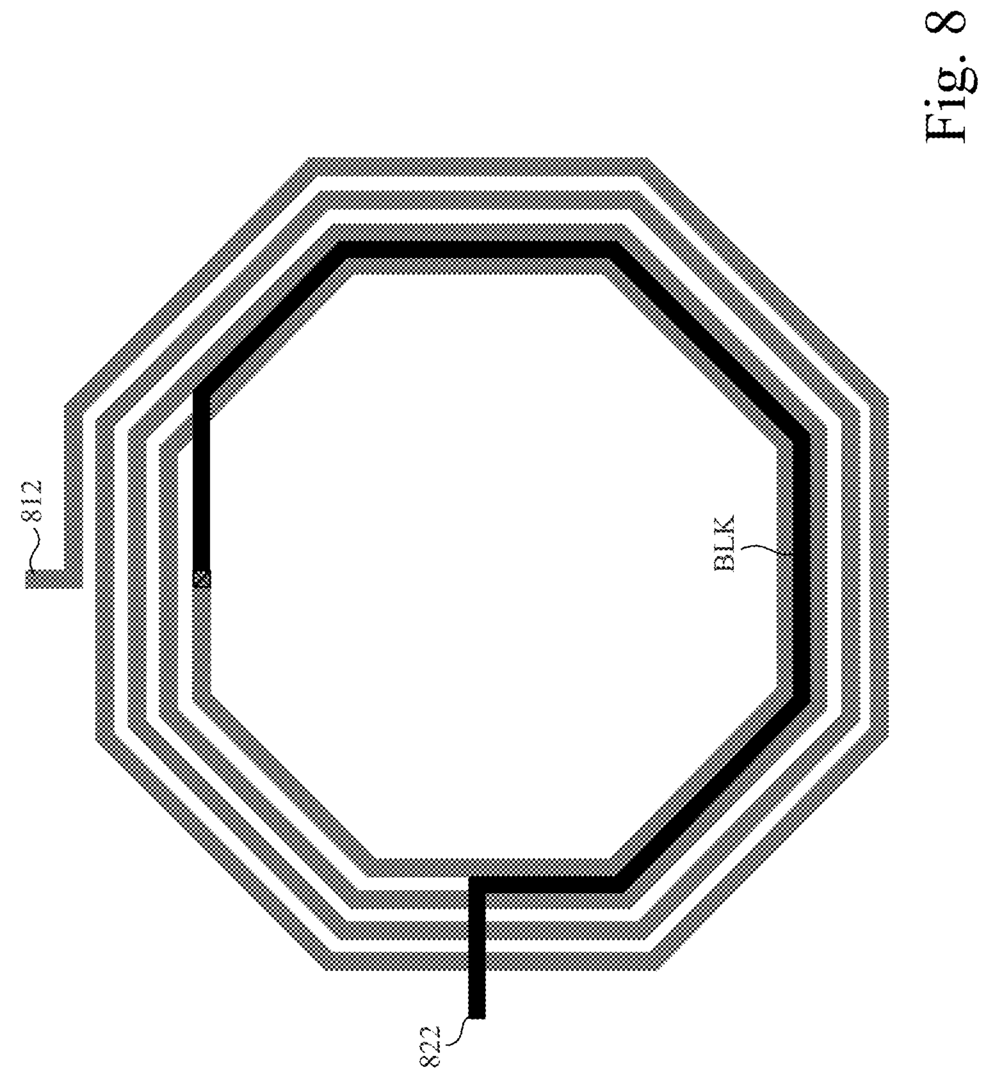
FIG. 8 illustrates a structure of the asymmetric spiral inductor according to another embodiment of the present invention.
Figure 9:
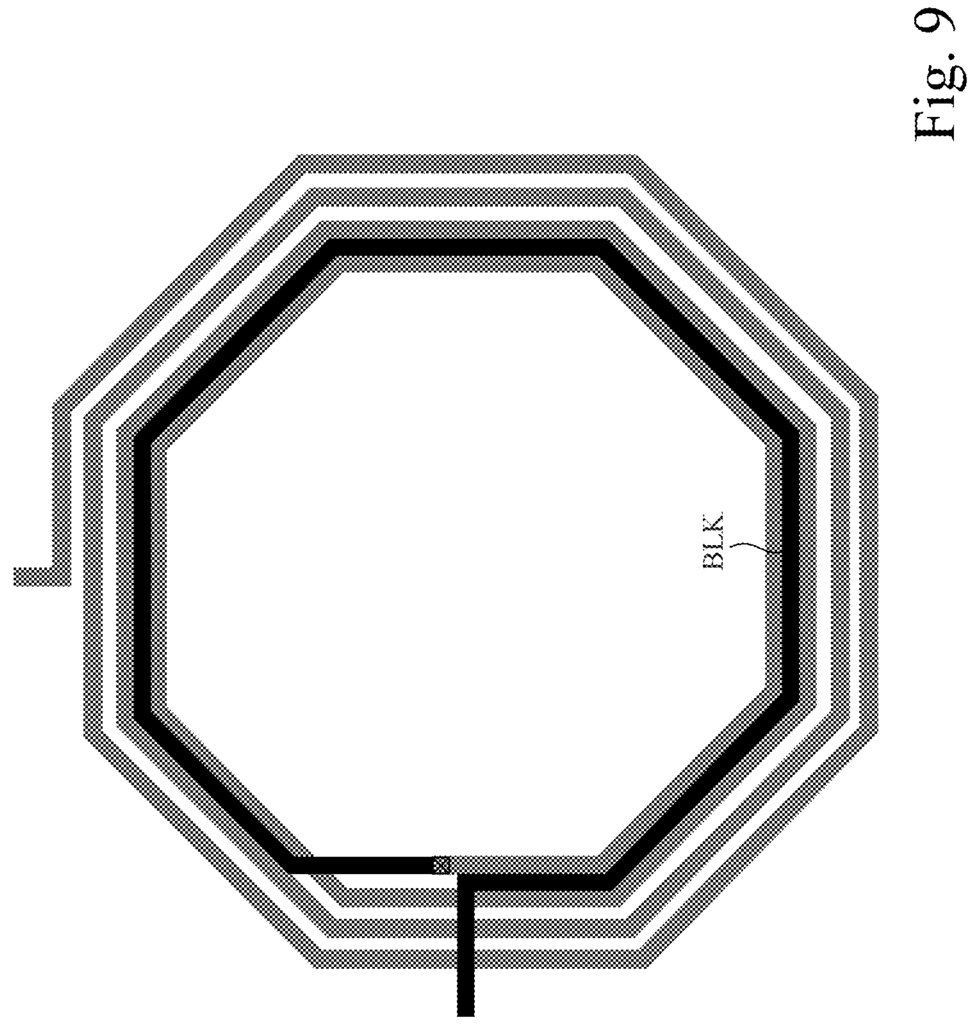
FIG. 9 illustrates a structure of the asymmetric spiral inductor according to another embodiment of the present invention.

Although the length of the metal segment fabricated in the upper metal layer and not forming a complete spiral coil (i.e., the metal segment in black) is approximately equal to a quarter turn of the lower spiral coil, the metal segment may have different lengths. As shown in FIGS. 7 to 9, the length of the metal segment BLK is about one-half turn, three-quarter turn and one turn of the spiral coil, respectively. Likewise, the shape of the metal segment BLK is substantially similar to a partial contour of the spiral coil. Since the resistance of the RDL is typically higher than that of the UTM layer, if the length of the metal segment BLK becomes greater than one turn of the spiral coil, the resistance of the metal segment BLK would become too high, resulting in the decrease in the quality factor Q of the asymmetric spiral inductance. Preferably, in the present invention, the length of the metal segment disposed in the metal layer having higher resistance is substantially not greater than one turn of the spiral coil.

Figure 10:
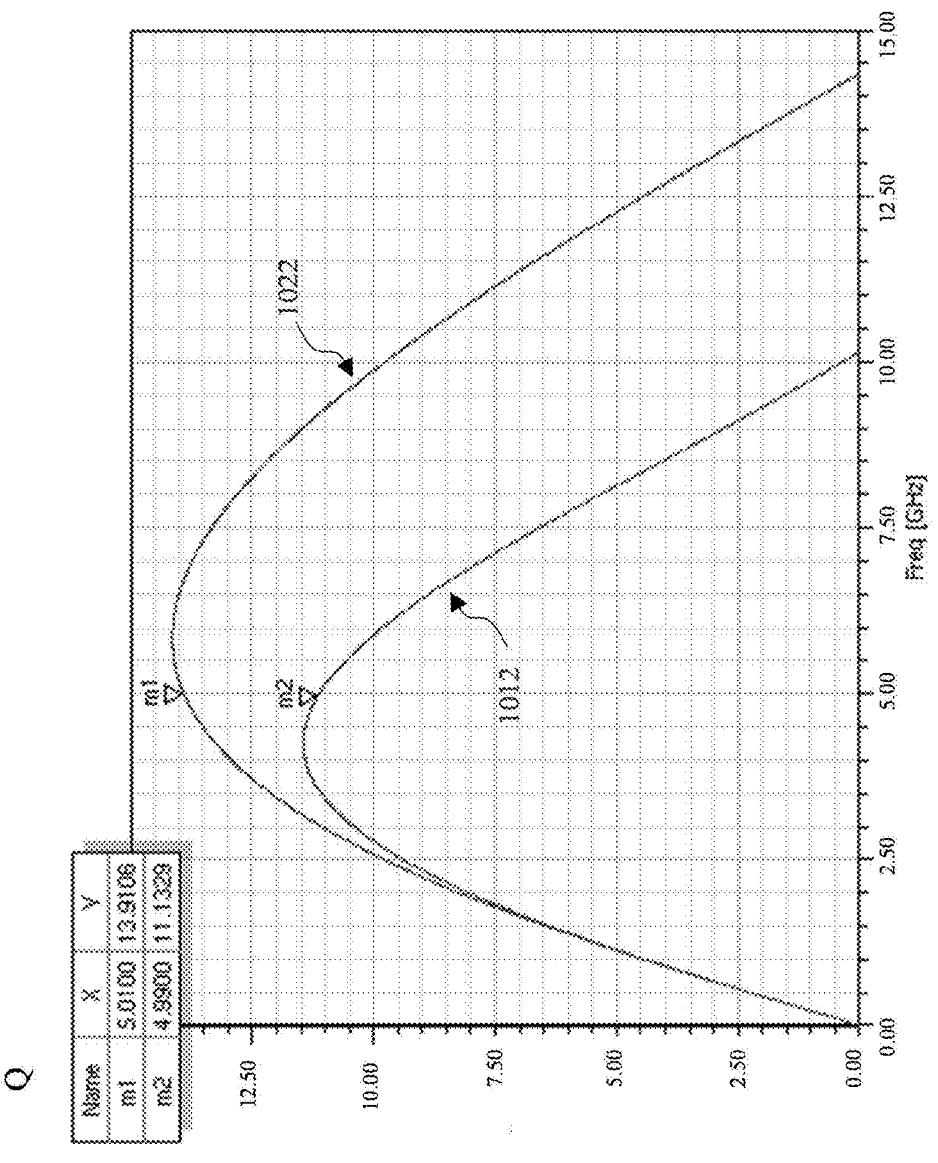
FIG. 10 illustrates the relationship between the quality factor Q and the frequency of the asymmetric spiral inductor of FIG. 8.

FIG. 10 shows the relationship between the quality factor Q and the frequency of the asymmetric spiral inductor of FIG. 8. The curve 1012 represents the quality factor Q when the signal is inputted from the terminal 812, and the curve 1022 represents the quality factor Q when the signal is inputted from the terminal 822. When the terminal 812 is used as the input terminal, the terminal 822 is directly or indirectly coupled to a reference voltage (e.g., ground), and the directions of the currents in the spiral coil and the metal segment BLK are both clockwise. When the terminal 822 is used as the input terminal, the terminal 812 is directly or indirectly coupled to a reference voltage (e.g., ground), and the directions of the currents in the spiral coil and the metal segment BLK are both counterclockwise. Because the difference between the curves 1012 and 1022 at high frequencies (e.g., frequencies greater than or equal to 5 GHz) is quite large (i.e., the difference in the quality factor Q is great), the asymmetric spiral inductor of the present invention has the advantage of suppressing signal reflections. For example, at the frequencies around 5 GHz, the quality factor Q corresponding to the case where the signal is inputted from the terminal 812 is about 11.1329, and the quality factor Q corresponding to the case where the signal inputted from the terminal 822 is about 13.9106; there is a difference of about 2.7777. When the frequency is greater than 5 GHz, the difference in the quality factor Q between the two cases becomes greater. More specifically, reflected signals are generated when the input signal inputted from the terminal 822 reaches the terminal 812; in this instance, the reflected signals encounter the poorer quality factor Q (corresponding to the curve 1012; that is, the reflected signals can be regarded as the signals inputted from the terminal 812). Therefore, the asymmetric spiral inductor of the present invention is more resistant to disturbances caused by the reflected signals.

Figure 11:
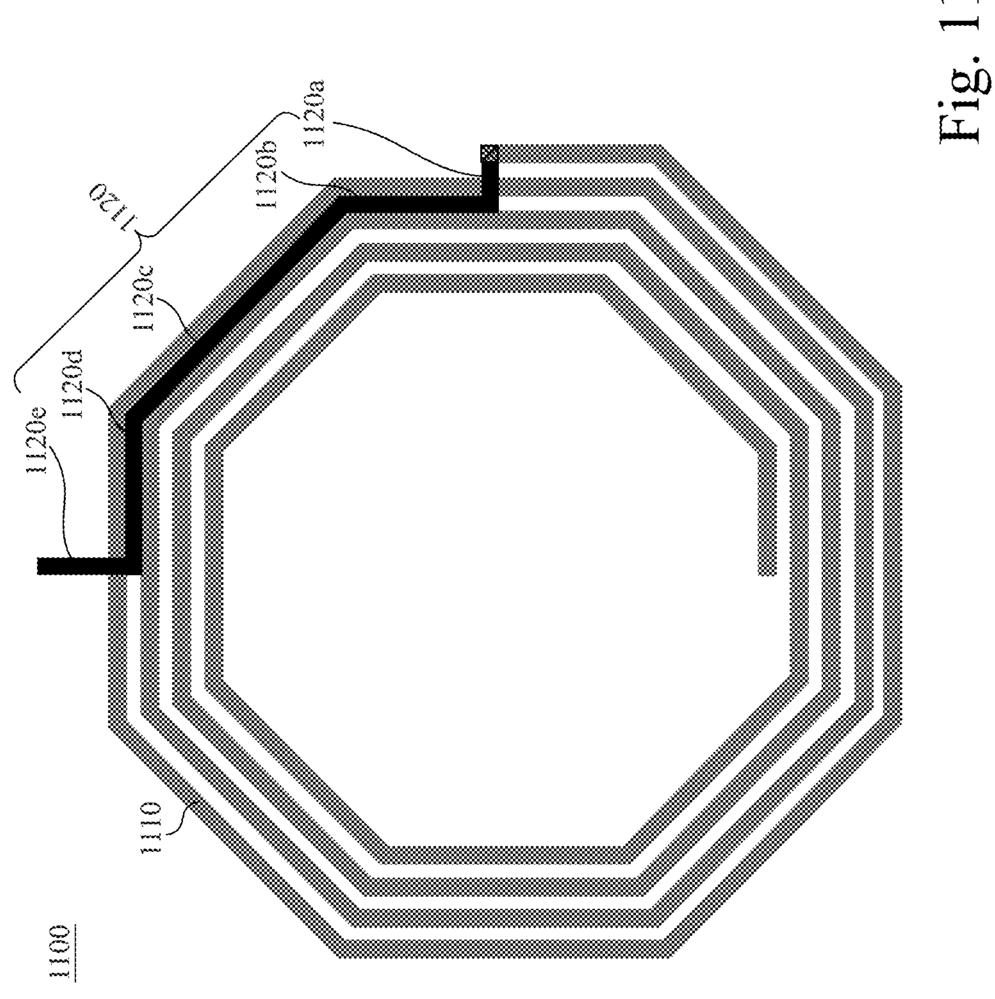
FIG. 11 illustrates a structure of the asymmetric spiral inductor according to another embodiment of the present invention.

FIG. 11 is a structure of the asymmetric spiral inductor according to another embodiment of the present invention. The asymmetric spiral inductor 1100 is fabricated in a semiconductor structure and mainly includes the metal segment 1110 and the metal segment 1120, which includes the metal sub-segments 1120*a* to 1120*e*. The metal sub-segment 1120*a* extends from the outside of the outermost turn of the spiral coil to a place between the innermost turn of the spiral coil and the outermost turn of the spiral coil. More specifically, the metal sub-segment 1120*a* crosses at least one turn of the spiral coil (one turn for this embodiment). The metal sub-segments 1120*b*, 1120*c* and 1120*d* each extend along one of the sides of the polygon and are substantially parallel to the side. The metal sub-segment 1120*b*, the metal sub-segment 1120*c*, and the metal sub-segment 1120*d* form a polyline metal segment whose shape is substantially the same as a partial contour of the polygon. The metal sub-segment 1120*e* extends from one terminal of the metal sub-segment 1120*d* to the outside of the outermost turn of the spiral coil. More specifically, the metal sub-segment 1120*e* extends from a place between the innermost turn of the spiral coil and the outermost turn of the spiral coil to a range not surrounded by the outermost turn of the spiral coil, and the metal sub-segment 1120*e* crosses at least one turn of the spiral coil (one turn for this embodiment). In the embodiment shown in FIG. 11, the number of turns that the metal sub-segment 1120*a* crosses is the same as the number of turns that the metal sub-segment 1120*e* crosses.

Figure 12:
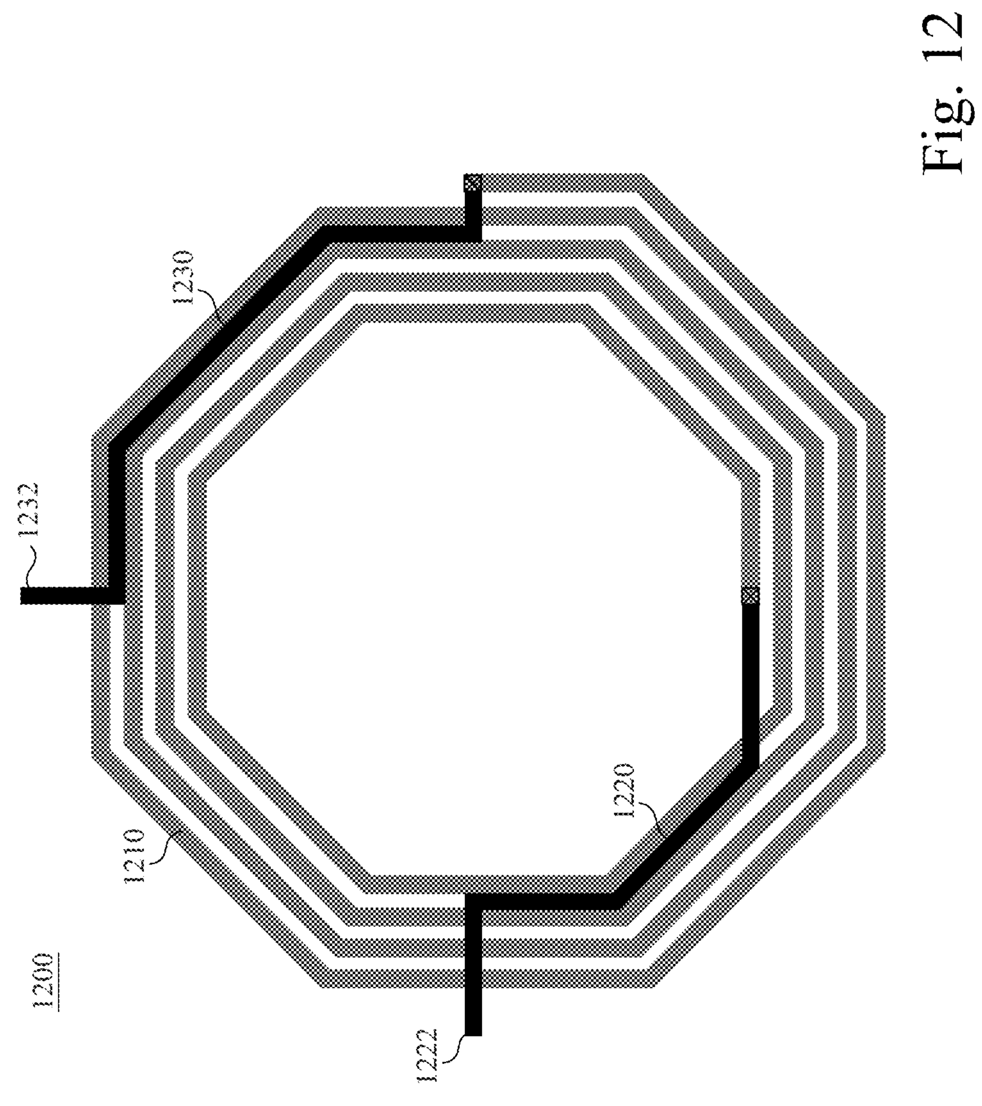
FIG. 12 illustrates a structure of the asymmetric spiral inductor according to another embodiment of the present invention.

FIG. 12 is a structure of the asymmetric spiral inductor according to another embodiment of the present invention. The asymmetric spiral inductor 1200 is fabricated in a semiconductor structure and mainly includes the metal segment 1210, the metal segment 1220, and the metal segment 1230. The two terminals 1222 and 1232 of the asymmetric spiral inductor 1200 are connected to the lower spiral coil through the metal segments 1220 and 1230 in the upper layer, respectively. By adjusting the lengths and/or widths of the metal segments 1220 and 1230, the quality factor Q corresponding to the terminal 1222 (i.e., signals inputted from the terminal 1222) may be closer to or more different from the quality factor Q corresponding to the terminal 1232 (i.e., signals inputted from the terminal 1232).

In summary, the present invention can increase the inductance of the asymmetric spiral inductor without increasing the inductor area, thereby improving the quality factor Q. In addition, the asymmetric spiral inductor of the present invention has extremely asymmetric quality factors Q, which helps to reduce signal reflections. Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An asymmetric spiral inductor fabricated in a semiconductor structure, comprising:

- a first metal segment, wherein the first metal segment is in a first metal layer, substantially forms a spiral coil, and has a first terminal and a second terminal;
- a second metal segment, wherein the second metal segment is in a second metal layer different from the first metal layer and has a third terminal and a fourth terminal; and
- a connection structure connecting the second terminal and the third terminal;
- wherein the first terminal and the fourth terminal form two terminals of the asymmetric spiral inductor, the spiral coil is a polygon with N sides, N is greater than 4, a portion of the second metal segment extends along a portion of the edge of the polygon, and the length of the second metal segment is not greater than one turn of the spiral coil;
- wherein when the asymmetric spiral inductor is operated at a frequency substantially greater than or equal to 5 GHz, a difference between a first quality factor corresponding to a first case where a signal is inputted to the asymmetric spiral inductor from the first terminal and a second quality factor corresponding to a second case where a signal is inputted to the asymmetric spiral inductor from the fourth terminal is greater than 2.7.

2. The asymmetric spiral inductor of claim 1, wherein the second metal segment comprises:

a first metal sub-segment connected to the first metal segment through the connection structure and extending from an innermost turn of the spiral coil to a place between the innermost turn of the spiral coil and an outermost turn of the spiral coil;

a second metal sub-segment connected to the first metal sub-segment, substantially parallel to a corresponding portion of the first metal segment, and substantially disposed between the innermost turn of the spiral coil and the outermost turn of the spiral coil; and a third metal sub-segment connected to the second metal sub-segment and extending from a place between the innermost turn of the spiral coil and the outermost turn of the spiral coil to an outside of the outermost turn of the spiral coil.

3. The asymmetric spiral inductor of claim 2, wherein the first metal sub-segment crosses at least two turns of the spiral coil, and the third metal sub-segment crosses at least two turns of the spiral coil.

4. An asymmetric spiral inductor fabricated in a semiconductor structure, comprising:

a spiral coil substantially disposed in a first metal layer and having a first terminal and a second terminal, wherein the first terminal is disposed at an outermost turn of the spiral coil, and the second terminal is disposed at an innermost turn of the spiral coil;

a metal segment disposed in a second metal layer different from the first metal layer and having a third terminal and a fourth terminal; and a connection structure connecting the second terminal and the third terminal;

wherein the first terminal and the fourth terminal form two terminals of the asymmetric spiral inductor, the spiral coil is a polygon with N sides, N is greater than 4, and a portion of the metal segment has a shape substantially the same as a portion of the contour of the polygon with N sides;

wherein when the asymmetric spiral inductor is operated at a frequency substantially greater than or equal to 5 GHz, a difference between a first quality factor corresponding to a first case where a signal is inputted to the asymmetric spiral inductor from the first terminal and a second quality factor corresponding to a second case where a signal is inputted to the asymmetric spiral inductor from the fourth terminal is greater than 2.7.

5. The asymmetric spiral inductor of claim 4, wherein the metal segment comprises:

a first metal sub-segment, wherein the first metal sub-segment is connected to the spiral coil through the connection structure and extends from the innermost turn of the spiral coil to a place between the innermost turn of the spiral coil and the outermost turn of the spiral coil;

a second metal sub-segment which is connected to the first metal sub-segment, substantially parallel to a corresponding portion of the spiral coil, and substantially disposed between the innermost turn of the spiral coil and the outermost turn of the spiral coil; and a third metal sub-segment, which is connected to the second metal sub-segment and extends from a place between the innermost turn of the spiral coil and the outermost turn of the spiral coil to an outside of the outermost turn of the spiral coil.

6. The asymmetric spiral inductor of claim 5, wherein the first metal sub-segment crosses at least two turns of the spiral coil, and the third metal sub-segment crosses at least two turns of the spiral coil.

* * * * *